(12) United States Patent
Hirano et al.

(10) Patent No.: US 8,299,410 B2
(45) Date of Patent: Oct. 30, 2012

(54) CASING STRUCTURE FOR ELECTRONIC EQUIPMENT

(75) Inventors: Kazuhiko Hirano, Yamanashi (JP); Kazuyuki Sasaki, Fuefuki (JP)

(73) Assignee: Fanuc Ltd, Yamanashi (JP)

( * ) Notice: Subject to any disclaimer, the term of this patent is extended or adjusted under 35 U.S.C. 154(b) by 104 days.

(21) Appl. No.: 12/929,069

(22) Filed: Dec. 28, 2010

(65) Prior Publication Data

US 2011/0198973 A1 Aug. 18, 2011

Related U.S. Application Data

(62) Division of application No. 11/488,639, filed on Jul. 19, 2006, now Pat. No. 7,923,670.

(30) Foreign Application Priority Data

Aug. 10, 2005 (JP) ................................. 2005-231806

(51) Int. Cl.
*H05B 6/64* (2006.01)
(52) U.S. Cl. ........................................ 219/757; 361/695
(58) Field of Classification Search .................. 219/757, 219/756, 754, 681, 400; 126/21 A, 299 R, 126/299 D; 361/695, 690, 692, 694
See application file for complete search history.

(56) References Cited

U.S. PATENT DOCUMENTS

| 4,520,425 | A | 5/1985 | Ito |
| 6,064,571 | A | 5/2000 | Noble |
| 6,860,323 | B2 | 3/2005 | Cheng |
| 7,177,148 | B2 * | 2/2007 | Nakata et al. ................. 361/695 |

FOREIGN PATENT DOCUMENTS

| JP | 59-30372 | 8/1984 |
| JP | 64-28776 | 2/1989 |
| JP | 7-294093 | 11/1995 |
| JP | 9-172281 | 6/1997 |
| JP | 2000-077876 | 3/2000 |
| JP | 2002-223091 | 8/2002 |
| JP | 2002-271072 | 9/2002 |

OTHER PUBLICATIONS

U.S. Appl. No. 11/488,639, filed Jul. 19, 2006, Kazuhiko Hirano et al., FANUC Ltd.
Notice of Reasons for Rejection, mailed Jun. 26, 2007 and issued in priority Japanese Patent Application 2005-231806.

(Continued)

*Primary Examiner* — Quang Van
(74) *Attorney, Agent, or Firm* — Staas & Halsey LLP

(57) ABSTRACT

A fan motor is mounted on the upper wall of the casing. The lower surface of this upper wall is formed into an inclined surface in which inclination is formed from the front wall side of the casing toward a back wall across from the front wall. When the fan motor is driven, oil mist or moisture contained in the air are condensed into water droplets or oil droplets. These water droplets or oil droplets fall and flow to the inner wall surface of the upper wall of the casing along the inner peripheral wall of a vent hole. Then the water droplets or oil droplets flow along the profile line of a vent hole smoothly (without stopping) and roll down the side wall of the casing.

7 Claims, 5 Drawing Sheets

OTHER PUBLICATIONS

Office Action mailed from the Unites States Patent and Trademark Office on Jun. 16, 2009 in the related U.S. Appl. No. 11/488,639.

Office Action mailed from the Unites States Patent and Trademark Office on Nov. 3, 2009 in the related U.S. Appl. No. 11/488,639.

Office Action mailed from the Unites States Patent and Trademark Office on Mar. 25, 2010 in the related U.S. Appl. No. 11/488,639.

Office Action mailed from the Unites States Patent and Trademark Office on Jun. 21, 2010 in the related U.S. Appl. No. 11/488,639.

Office Action mailed from the Unites States Patent and Trademark Office on Oct. 12, 2010 in the related U.S. Appl. No. 11/488,639.

Notice of Allowance mailed from the U.S. Patent and Trademark Office on Jan. 13, 2011 in the related U.S. Appl. No. 11/488,639.

* cited by examiner

CASING STRUCTURE FOR ELECTRONIC EQUIPMENT

RELATED APPLICATIONS

This application is a divisional of U.S. application Ser. No. 11/488,639, filed Jul. 19, 2006, now U.S. Pat. No. 7,923,670. This application is based upon and claims the priority of Japanese Patent Application No. 2005-231806, filed Aug. 10, 2005, the entire contents of which are incorporated herein by reference.

BACKGROUND OF THE INVENTION

1. Field of the Invention

The present invention relates to a casing structure of electronic equipment used in a numerical control device or control devices for various machines.

2. Description of the Related Art

The electronic equipment used in a numerical control device or control devices for various machines comprises a fan motor for cooling the control boards or electronic components provided inside the casing of the electronic equipment. If such electronic equipment is operated for a long period of time in a manufacturing floor such as a factory, moisture, cutting oil and the like contained in the air inside the factory accumulates in the form of mist on the casing of the fan motor. When placing the fan motor at an upper section of the electronic equipment, the moisture and oil accumulated on the casing of the fan motor drip down in the form of water droplets and oil droplets into the electronic equipment and adhere to the control boards and the like of the electronic equipment, causing failures such as shorting of the electronic components and acceleration of deterioration.

FIG. 9 is a cross-sectional diagram showing a structure of attaching a fan motor to conventional electronic equipment. A casing 2 is attached to the back of a display section 1 of the electronic equipment, and a plurality of control boards 3 in which electronic components are disposed in printed boards and the like are stored in this casing 2. An upper wall of the casing 2 is provided with a vent hole 4, and a fan motor 5 is attached in the upper section of this vent hole 4. By operating the fan motor 5, the air inside the casing 2 is drawn and discharged to the outside, thereby cooling the electronic components disposed in the control board 3.

By operating the fan motor 5, moisture, cutting oil or the like contained in the air adhere in the form of mist to a housing 6 of the fan motor 5, are then condensed into a water droplet or oil droplet 7, and falls. This water droplet or oil droplet 7 is generated on a random position and adheres to the control boards 3 or electronic components, causing shorting and failure of the electronic components.

Therefore, for the purpose of improving such problem, Japanese Patent Application Laid-Open No. 9-172281 proposes a configuration in which the bottom section of a fan motor is inclined in a horizontal direction and attached to the casing of electronic component, and water droplets and oil droplets on the bottom section of the fan motor are guided along the bottom section, which is the inclined surface, to reach an end section of the fan motor so that the water droplets and oil droplets do not drop positions of the control boards and the like inside the electronic equipment.

In the invention described in the patent literature described above, the fan motor is simply inclined and attached to the casing. Therefore, depending on the shape of the fan motor, oil and the like adhered to the housing of the fan motor do not always drop in one direction.

Moreover, although water droplets and oil droplets fall vertically on a predetermined region when the fan motor is stopped, the problem is that when the fan motor is driven the water droplets and oil droplets do not drop vertically due to the flow of the air drawn by the fan motor, but adhere to the control boards or electronic components.

SUMMARY OF THE INVENTION

An object of the present invention is to provide a casing structure for electronic equipment which can reliably guide condensed oil and water attached to the housing and the like of the fan motor so that the oil and water do not adhere to the control boards and electronic equipments inside the electronic equipment.

In a first embodiment of the casing structure for electronic equipment according to the present invention, a fan motor is attached to an upper part of a vent hole formed on an upper wall of a casing, an inner wall surface of the upper wall of the casing in which the vent hole is formed is formed into a inclined surface in which one side wall of the casing is lowered and the other side wall or an opening across therefrom is raised, and the vent hole is formed on the upper wall such that a profile line of the vent hole on the inclined surface is not raised in mid-course but only descends at least between a point of the highest position thereof and a point in which the profile line intersects with a line which passes through substantially the center of the vent hole and is perpendicular to the inclination direction of the inclined surface.

The vent hole may be formed on the upper wall of the casing such that a point of the lowest position of the profile line or two or more points of locally low positions on the profile line is formed on the one side wall of the casing.

In the vicinity of the point of the highest position on the profile line of the vent hole on the inner wall surface of the upper wall of the casing, in addition to the inclination of the inclined surface, an inclination may be added in a direction of extension of the profile line to form a valley section.

In the vicinity of the point of the lowest position on the profile line of the vent hole on the inner wall surface of the upper wall of the casing, in addition to the inclination of the inclined surface, an inclination may be added in a direction of extension of the profile line to form a mountain section.

In order to form the inner wall surface of the upper wall of the casing into the inclined surface, the board thickness of the upper wall may be changed continuously or stepwise in one direction.

The fan motor may be attached to the upper wall of the casing via a protruding section formed on the upper wall.

In the second embodiment of the casing structure for electronic equipment according to the present invention, a rib protruding downward is provided on an inner wall surface of the upper wall in the casing at a periphery of the vent hole, an end surface of the rib is formed as an inclined surface in which one side wall of the casing is lowered and the other side wall or an opening across therefrom is raised, and the rib is provided on the upper wall such that the end surface thereof is not raised in mid-course but only descends at least between a point of the highest position of the rib and a point in which the end surface intersects with a line which passes through substantially the center of the vent hole and is perpendicular to the inclination direction of the end surface.

The vent hole may be formed on the upper wall of the casing such that a point of the lowest position on the profile line or two or more points of locally low positions on the profile line is formed on the one side wall of the casing.

The amount of protrusion of the rib from the inner wall surface of the upper wall of the casing may be the minimum at the vicinity of the point of the highest position on the profile line of the vent hole on the inclined surface, and the amount of the protrusion may be enlarged gradually from that point along a direction of extension of the rib, to form a valley section.

The amount of protrusion of the rib from the inner wall surface of the upper wall of the casing may be the maximum at the vicinity of the point of the lowest position or the locally low point on the profile line of the vent hole on the inclined surface, and the amount of the protrusion may be reduced gradually from that point along a direction of extension of the rib, to form a mountain section.

In order to form the inclined surface on the end surface of the rib, the length of the protrusion of the rib from the upper wall of the casing to a lower section may be changed continuously or stepwise in one direction.

In order to form the inclined surface on the end surface of the rib, the upper wall of the casing in which the rib is formed may be inclined, and the length of the downward protrusion of the rib from the upper wall of the casing may be made constant throughout the whole length of the rib.

The fan motor may be attached to the upper wall of the casing via a protruding section formed on the upper wall.

Since the present invention is configured as above, water droplets and oil droplets condensed by the fan motor can be guided reliably and discharged to a predetermined safe place so that the water droplets and oil droplets do not adhere to the control boards and electronic components inside the electronic equipment. Accordingly, the control boards disposed inside the casing of the electronic equipment and the electronic components installed in the control boards can be prevented from adhesion of water droplets and oil droplets, whereby shorting, failure, and reduction of the life of the electronic components can be prevented.

BRIEF DESCRIPTION OF THE DRAWINGS

The above-described and other objects and characteristics of the present invention are made apparent in the description of the embodiments below with reference to the attached diagrams, in which.

DETAILED DESCRIPTION OF EMBODIMENTS

The first embodiment of the present invention is described using FIG. 1 through FIG. 6.

Figure 1:
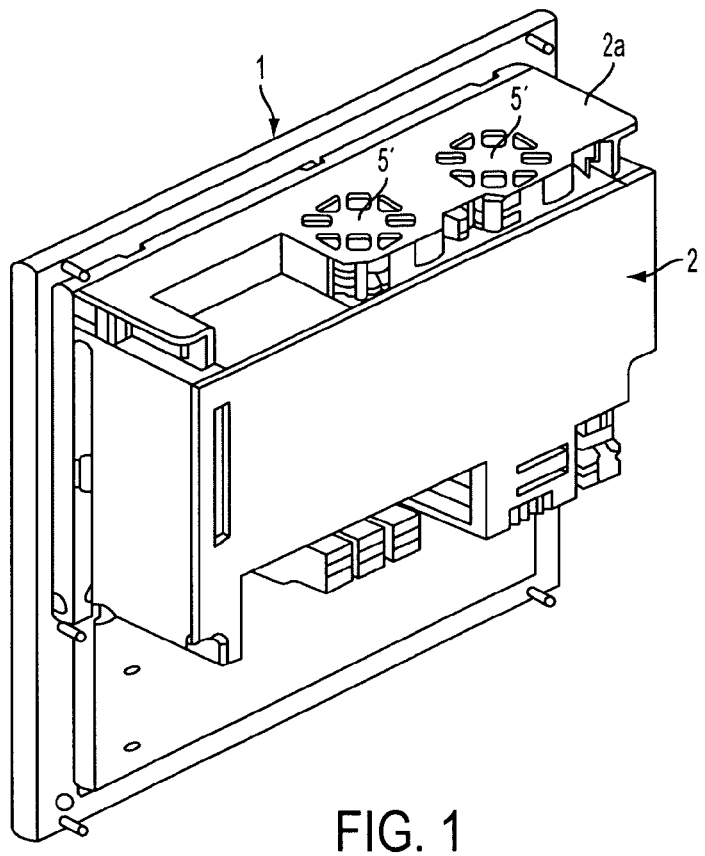
FIG. 1 is an outline drawing of a control device to which the first embodiment of the casing structure for electronic equipment of the present invention is added.

FIG. 1 is an outline drawing of a control device to which the casing structure for electronic equipment of the present invention is applied. In FIG. 1, the reference numeral 1 is a display section, and this display section 1 constitutes a side wall of a casing 2. A plurality of control boards or electric and electronic components in which electronic components and the like are installed are disposed inside the casing 2. In FIG. 1, the reference numeral 5' indicates an area in which a fan motor is attached. In the example shown in FIG. 1 two fan motors are attached.

Figure 2:
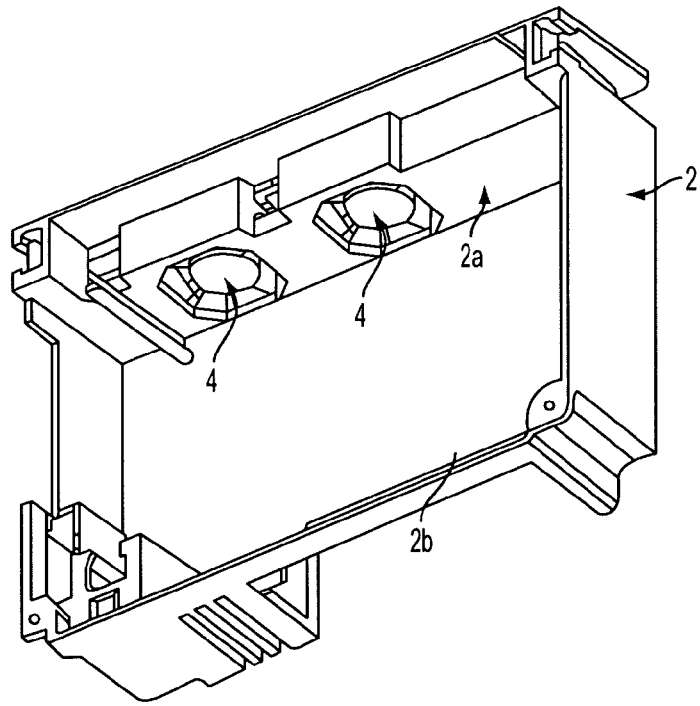
FIG. 2 is a perspective view in which a display section is removed from the control device shown in FIG. 1 and the casing of the electronic equipment is viewed from the inside thereof.
Figure 3:
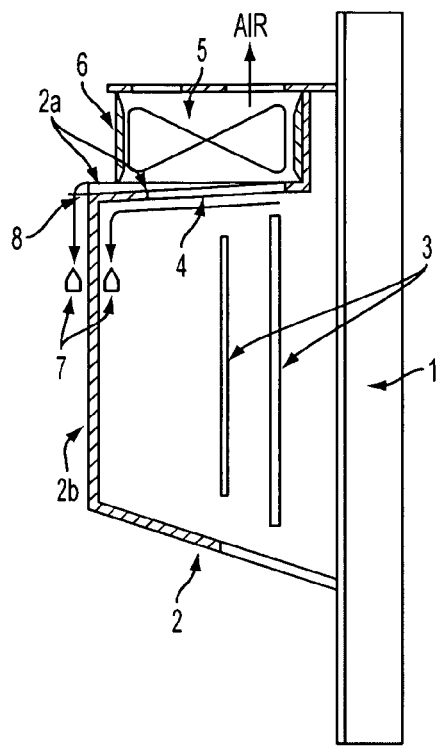
FIG. 3 is a cross-sectional diagram of one of fan motor attachment positions in the control device shown in FIG. 1.

FIG. 2 is a perspective view in which the display section 1 is removed from the control device shown in FIG. 1 and the casing 2 is viewed from the inside thereof. Further, FIG. 3 is a cross-sectional diagram of one of fan motor attachment positions in the casing 2.

The display section 1 is attached to a front opening section of the casing 2, and this display section constitutes one side wall (front wall) of the casing 2. The electric and electronic components, a plurality of control boards 3, and the like are disposed inside the casing 2. Furthermore, two vent holes 4 are formed on an upper wall 2a of the casing 2, and a fan motor 5 is attached to an upper section (an external wall surface of the upper wall 2a of the casing 2) of each of these vent holes 4.

The other side of the surface attached with the fan motors 5 of the upper wall 2a of the casing 2, that is, inner wall surface of the upper wall 2a, is formed into an inclined surface in which inclination is formed progressively (continuously or stepwise) from the front wall (display section 1) side of the casing 2 toward a back wall 2b where the front wall (display section 1) side of the casing 2 is higher than the back wall 2b across from the front wall.

Moreover, an outer periphery of the vent hole 4 of the upper wall 2a of the casing is provided with a protruding section 8 for mounting and attaching the housing 6 of the fan motor 5. In a position other than this protruding section 8, a gap is formed between the upper wall 2a of the casing 2 and the housing 6 by this protruding section 8.

Figure 4A:
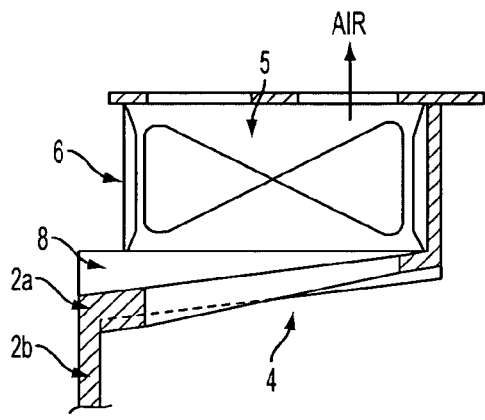
FIGS. 4A and 4B are, respectively, a cross-sectional diagram of an enlarged side view and a cross-sectional diagram of an enlarged front view of a vent hole section on an upper section of the casing in the casing structure shown in FIG. 3.
Figure 4B:
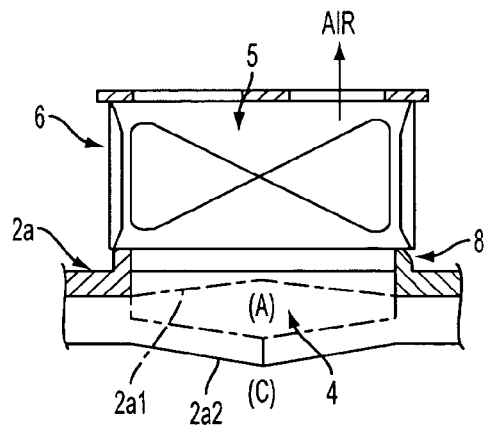

FIG. 4A and FIG. 4B are cross-sectional diagrams (side view and front view respectively) of the structure of an upper part of the casing at the vent hole 4. Each of the figures shows a state in which the fan motor 5 is mounted on the upper wall 2a of the casing 2.

In the example shown in FIG. 4A, at least a section around the vent hole 4 on the upper wall 2a of the casing 2 is formed into an inclined surface in which the front wall side (display section 1 side) is raised and the back wall 2b side across therefrom is lowered.

Moreover, in this inclined upper wall 2a of the casing 2, the raised front wall side (display section 1 side) is made thin, while the lowered back wall 2b side is made thick as shown in FIG. 4A. In this manner, on the inner wall surface (bottom surface) of the upper wall 2a of the casing 2, at least the section around the vent hole 4 is formed such that the front wall side (display section 1 side) is further raised and the back wall 2b side across therefrom is further lowered. Specifically, by changing the thickness of the inclined upper wall 2a of the casing 2 gradually from one end side (higher side) toward the other end side (lower side), the degree of inclination of the inner wall surface of the upper wall 2a of the casing 2 is further enhanced.

It should be noted that an inclination may be added to the inner wall surface (bottom surface) of the upper wall 2a of the casing 2 by simply changing the thickness of the upper wall 2a of the casing from one end side toward the other end side without causing the upper wall 2a of the casing to incline.

FIG. 5A through FIG. 5D are explanatory diagrams showing the shape of the vent hole 4 provided on the inclined surface of the upper wall 2a of the casing 2. These figures show examples of the shape of a profile line 4a of the vent hole 4 viewed from the inside of the casing 2.

Figure 5A:
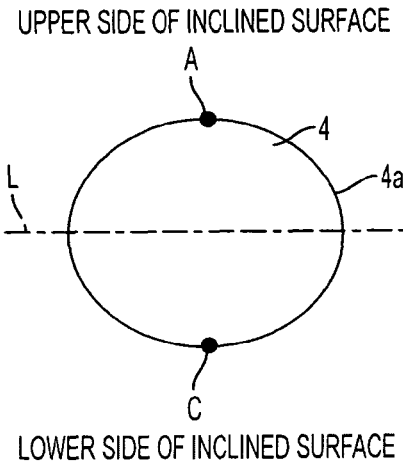
FIG. 5A through FIG. 5D are explanatory diagrams showing examples of the shape of the profile line of the vent hole, which can be applied to the casing structure for electronic equipment according to the present invention.
Figure 5B:
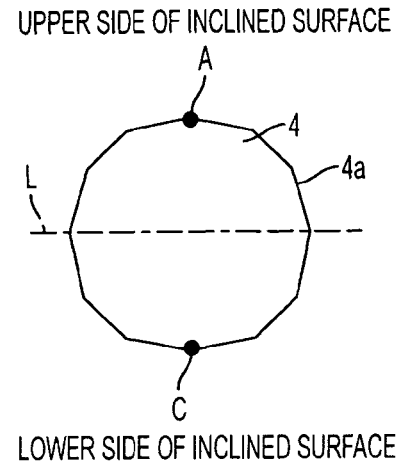
Figure 5C:
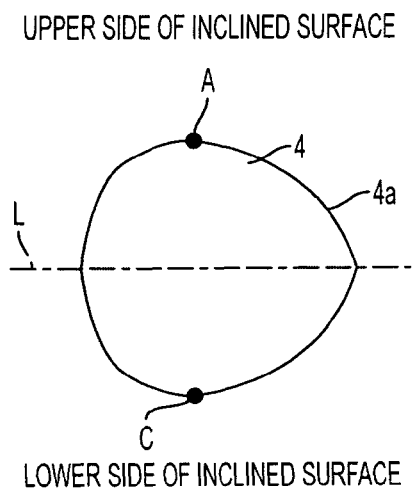
Figure 5D:
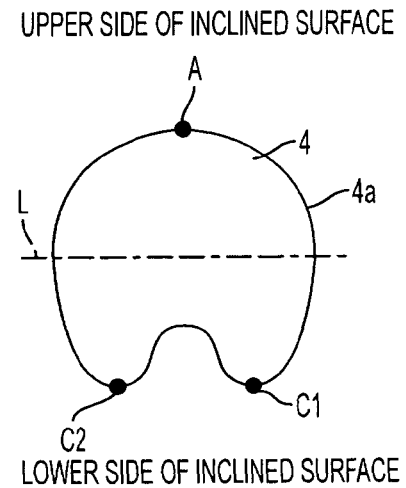

The upper part in each figure shows the front wall side (display section 1 side) of the casing 2 and the lower side shows the back wall 2b of the casing 2. Specifically, the inner wall surface of the casing 2 around on the periphery of the profile line 4a is inclined in a top-to-bottom direction on the page. In FIG. 5A through 5C, the point A on the profile line 4a represents the highest position proximate to the front wall (display section 1) of the casing 2, and the point C represents the lowest position proximate to the back wall 2b of the casing 2. An inclination in a direction of movement of an oil droplet 7 moving from any of the points on the profile line 4a is a component of the top-to-bottom direction (vertical direction) of the tangent line on the profile line 4a at the abovementioned point. Further, the dashed line L in the FIG. 5A through 5D represents a contour line (central contour line) of the inner wall surface of the inclined upper wall 2a of the casing, which passes through substantially the center of the vent hole 4.

In FIG. 5A, the profile line 4a shaping the vent hole 4 is in the form of a circle or oval with a continuous curved line. Further, according to need or from the perspective of a process, the profile line 4a of the vent hole 4 may be formed by connecting straight lines (to form a polygon) as shown in FIG. 5B, or may be formed into any shape as shown in FIG. 5C.

In the present invention, the vent hole 4 is formed on the upper wall 2a of the casing 2 such that, when moving on the profile line 4a from the point A indicating the highest position to the right or left, the profile line 4a continues to descend until reaching at least a position intersecting with the central contour line L without moving upward at any section in mid-course. In this manner, as described hereinafter, the oil droplet 7 and the like are prevented from stopping in mid-course and accumulating while moving along the profile line 4a of the vent hole 4.

Figure 6:
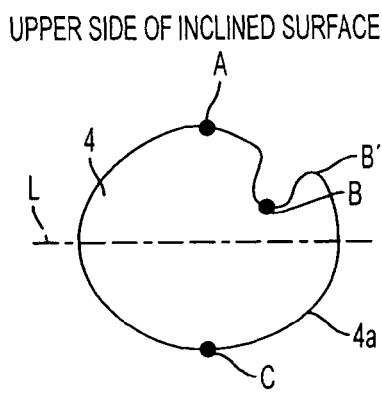
FIG. 6 is an explanatory diagram showing an example of the shape of the profile line of the vent hole, which cannot be applied to the casing structure for electronic equipment according to the present invention.

In FIG. 6, the profile line 4a of the vent hole 4 moves from the point A indicating the highest position to the right, and continues to descend until reaching the point B in mid-course before intersecting with the central contour line L. However, after the point B, the profile line 4a rises to the position of the point B'. As a result, the oil droplet 7 and the like generated from the housing 6 of the fan motor 5 are accumulated at the position of the point B and cannot proceed to the point C, which indicates the lowest position, along the profile line 4a after passing the point B'. The oil droplet 7 and the like accumulated in this position of the point B eventually fall from this position.

Therefore, as shown in FIG. 5A through FIG. 5D, the profile line 4a of the vent hole 4 forms the vent hole 4 such that it continues to drop from the point A at the highest position of the profile line 4a to the right or left until passing at least the central contour line L, and does not rise in mid-course.

FIG. 5A through FIG. 5C show that the profile line 4a of the vent hole 4 continues to drop until reaching the point C at the lowest position even after passing the central contour line L. As a result, the oil droplet 7 and the like which have rolled down the profile line 4a fall from the point C at the lowest position along the inner wall of the casing 2.

However, in the section below the central contour line L in the profile line 4a of the vent hole 4, there may be a section in which the oil droplet 7 does not always continue to fall and moves upward in mid-course. In the example shown in FIG. 5D, two locally low sections (C1, C2) are formed on the profile line 4a of the vent hole 4. As a result, the oil droplet 7 and the like which have rolled down the profile line 4a are collected at the point C1 and point C2 and fall from these points C1 and C2 along the inner wall of the casing 2.

According to the above-described configuration, the fan motors 5 are driven, the air inside the casing 2 is drawn and discharged to the outside through the vent hole 4, and the electronic components installed in the control boards 3 and the like are cooled down. If the fan motors 5 are used for a long period of time, the moisture and oil mist contained in the air adhere to the housing 6 of the fan motor 5 and are condensed, form water droplets or oil droplets 7, and then roll down a side wall of the housing 6.

The water droplet or oil droplet 7 flowing to the outside the casing 2 roll down an external wall surface of the upper wall 2a and of the back wall 2b of the casing 2 by means of the gap between the housing 6 and the casing upper wall 2a, which is formed by the protruding section 8 provided on the periphery of the vent hole 4 and mounting the housing 6 of the fan motor 5 thereon, thus the water droplet or oil droplet 7 does not enter the inside of the casing 2.

On the other hand, the water droplet or oil droplet 7, which flowed along the inner peripheral wall of the vent hole 4 from the housing 6 of the fan motor 5 to the inner wall surface (inclined surface) of the upper wall 2a of the casing 2, flows to a lower section along the profile line 4a of the vent hole 4, is then collected at the point C at the lowest position (or the points C1 and C2 at the locally low positions), moves to the inner wall surface of the back wall 2b of the casing 2 from these positions C (or C1 and C2), and rolls down the inner wall surface, as described above.

Therefore, the water droplet or oil droplet 7, which flowed through the vent hole 4 to the inner wall surface (inclined surface) of the upper wall 2a of the casing 2, no longer drops on and adheres to the control boards 3 inside the casing 2, the electronic components installed in the control boards 3 or the display section 1.

In the first embodiment described above, the bottom surface of the casing upper wall 2a to which the fan motors 5 are attached is the inclined surface. However, since the water droplet or oil droplet 7 dropping along the bottom surface of the casing upper wall 2a rolls down the profile line 4a of the vent hole 4, this part on the profile line 4a may be formed as the inclined surface.

Figure 7:
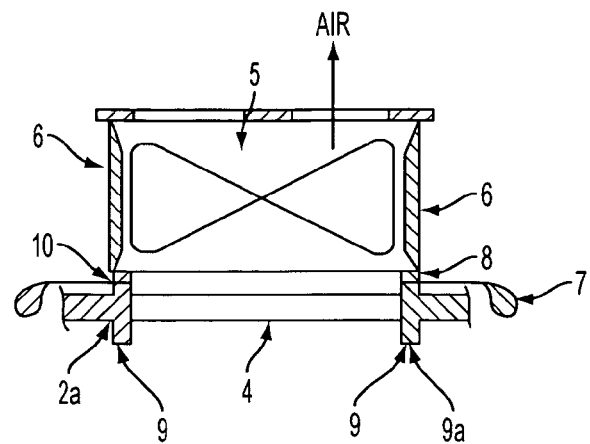
FIG. 7 is an explanatory diagram of a substantial part of a second embodiment of the casing structure for electronic equipment according to the present invention.

Here, FIG. 7 is used to described hereinafter a second embodiment of the present invention in which a rib is formed on the profile line 4a in a protruding fashion so as to protrude toward the inside (lower section) of the casing 2, and an end surface (bottom surface) of the rib is inclined.

FIG. 7 is a partial drawing showing an attachment section for the fan motors 5 in the second embodiment of the casing structure according to the present invention. In this embodiment, unlike the first embodiment described above (see FIG. 4A), the inner wall surface of the upper wall 2a of the casing 2 is horizontal.

On this upper wall 2a, the rib 9 protrudes downward (toward the inside of the casing 2) from a rim of the vent hole 4 (the section equivalent to the profile line 4a). Specifically, the rib 9 encloses the entire circumference of the vent hole 4 formed on the upper wall 2a. The height (protrusion amount) of the rib 9 is formed such that the front wall (display section 1) side of the casing 2 is low, while the back wall 2b side across from the front wall is high, with the result that an end surface 9a of the rib 9 inclined downward from the front wall (display section 1) side to the back wall 2b side progressively (continuously or stepwise).

The rest is configured in the same manner as in the first embodiment described above, wherein the outer periphery of the vent hole 4 of the casing upper wall 2a is provided with the protruding section 8 for mounting and attaching the housing 6 of the fan motor 5. The reference numeral 10 in FIG. 7 is a gap between the casing upper wall 2a and the housing 6 of the fan motor 5 which is mounted on and attached to the protruding section 8.

In the second embodiment, as described above, the inner wall surface of the upper wall 2a of the casing 2 is not the inclined surface, but the end surface 9a of the rib 9 is the formed as the inclined surface by forming the rib 9 along the profile line 4a of the vent hole 4, and progressively increasing the amount of downward protrusion (height) of the rib 9 from the front wall (display section 1) side to the back wall 2b side. Instead, the inner wall surface of the casing upper wall 2a may be formed as the inclined surface, and the rib 9 with constant height may be formed so as to enclose the entire circumference of the vent hole 4 formed on the upper wall 2a. In this manner, the same inclination as the inclination of the inner wall surface of the casing upper wall 2a is applied to the end surface 9a of the rib 9.

Figure 8:
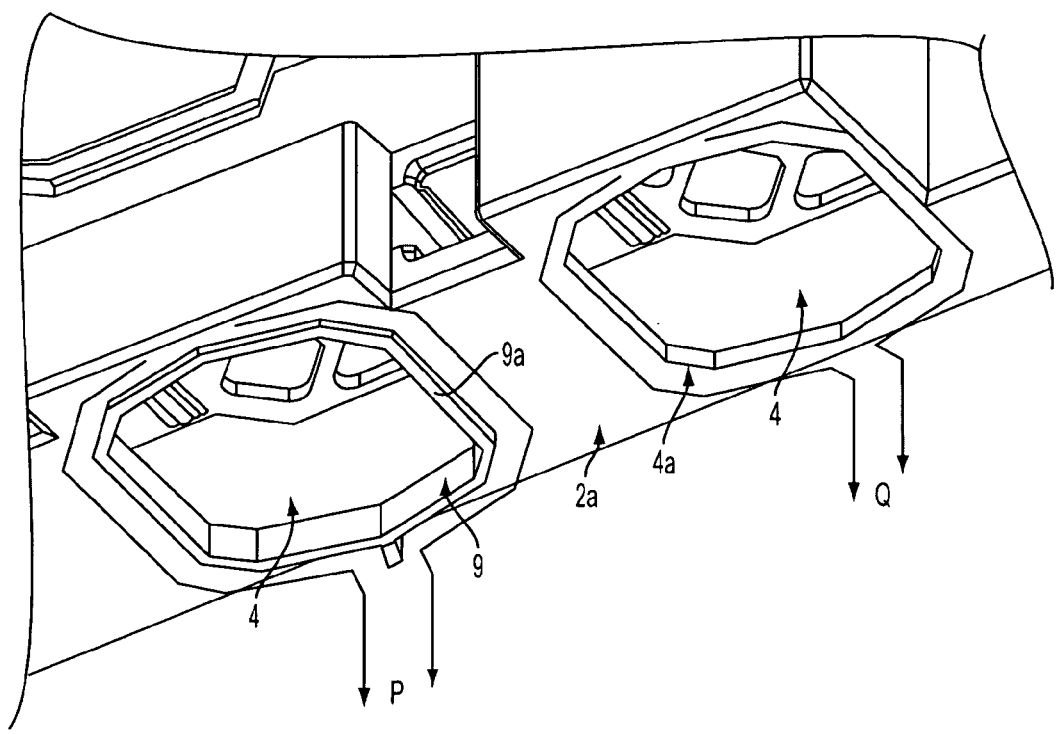
FIG. 8 is an enlarged explanatory diagram for explaining a flow of a water droplet or oil droplet in the first and second embodiments of the casing structure for electronic equipment according to the present invention, wherein the vent hole is viewed from the inside of the casing.
Figure 9:
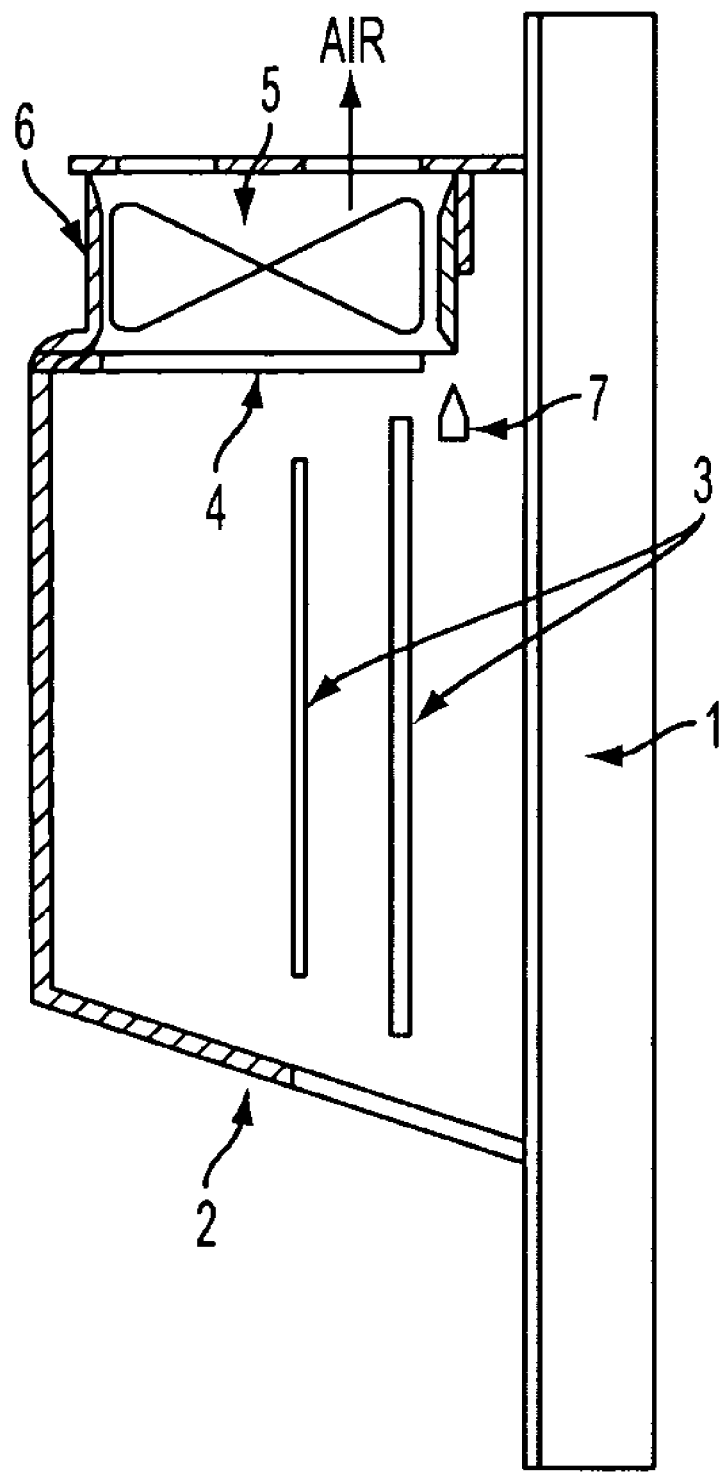
FIG. 9 is a cross-sectional diagram of a fan motor attachment position of a casing for electronic equipment of a prior art.

Here, the flow of the water droplet or oil droplet 7 in the casing structure of the first embodiment and of the second embodiment is described with reference to FIG. 8. FIG. 8 is a figure in which the vent hole 4 formed on the upper wall 2a of the casing 2 is viewed from the inside of the casing 2.

The rim of the vent hole 4 on the left of FIG. 8 is provided with the rib 9, showing the casing structure of the second embodiment. In the second embodiment, as indicated with the arrows P, the oil droplet 7 or the like moves along the inclined end surface 9a of the rib 9 from the front wall (display section 1) side of the casing 2 to the back wall 2b side across from the front wall, and reaches the end surface 9a of the rib 9 at the lowest position. Moreover, the water droplet or oil droplet 7 from this position, reaches the back wall 2b, and drops along the back wall 2b.

On the other hand, the vent hole 4 on the right of FIG. 8 is formed on the upper wall 2a in which the inner wall surface thereof is inclined, showing the casing structure of the first embodiment described above. In this first embodiment, as indicated with the arrows Q, the oil droplet 7 or the like moves on the inclined inner wall surface of the upper wall 2a, follows the profile line 4a of the vent hole 4, moves from the front wall (display section 1) side of the casing 2 to the back wall 2b side across from the front wall, and reaches the lowest position on the profile line 4a. Moreover, the water droplet or oil droplet 7 from this position, reaches the back wall 2b, and drops along the back wall 2b.

As described above, the water droplet or oil droplet 7 follows the profile line 4a of the vent hole 4 formed on the upper wall 2a, and moves from one side wall (or opening side) to the other side wall of the casing 2 along the inclined inner wall surface of the upper wall 2a of the casing 2 (first embodiment) or the inclined end surface 9a of the rib 9 (second embodiment). Depending on the degree of inclination of the inner wall surface of the upper wall 2a of the casing 2 or the rib 9 in the direction of movement of the oil droplet 7, the water droplet or oil droplet 7 can move easily.

For example, when the vent hole 4 shown in FIG. 5A is formed on the upper wall 2a of the casing 2, the oil droplet 7 in the vicinity of the point A at the highest position on the profile line 4a moves along the inner wall surface of the upper wall 2a or the end surface 9a of the rib 9 whose inclination in the direction of movement of the oil droplet 7 is extremely small, because the direction of movement of the oil droplet 7 (or direction of the tangential line of the profile line 4a) is almost perpendicular to the direction of inclination of the inner wall surface of the upper wall 2a or of the end surface 9a of the rib 9 (or perpendicular to the top-to-bottom direction in FIG. 5A).

Furthermore, in the similar manner, the oil droplet 7 in the vicinity of the point C at the lowest position on the profile line 4a moves to the point C along the inner wall surface of the upper wall 2a or the end surface 9a of the rib 9 whose inclination in the direction of movement of the oil droplet 7 is extremely small, because the direction of movement of the oil droplet 7 is almost perpendicular to the direction of inclination of the inner wall surface of the upper wall 2a or of the end surface 9a of the rib 9.

Therefore, in the vicinity of the point A at the highest position on the profile line 4a in FIG. 5A, the inner wall surface of the upper wall 2a or the end surface 9a of the rib 9 is further inclined along the profile line 4a, that is, a valley section is formed in the vicinity of the point A on the inner wall surface of the upper wall 2a, so that the oil droplet 7 in the vicinity of the point A is allowed to move easily along the inner wall surface of the upper wall 2a or the end surface 9a of the rib 9, in a direction for moving away from the point A.

Moreover, even in the vicinity of the point C at the lowest position on the profile line in FIG. 5A, the inner wall surface of the upper wall 2a or the end surface 9a of the rib 9 is further inclined along the profile line 4a, that is, a mountain section is formed in the vicinity of the point C on the inner wall surface of the upper wall 2a, so that the oil droplet 7, which is positioned in a little distance away from the point C, is allowed to follow the profile line 4a and move easily toward the point C at the lowest position, along the inner wall surface of the upper wall 2a or the end surface 9a of the rib 9.

In the first embodiment described above, the chain double-dashed line 2a1 in FIG. 4B represents the valley section which is formed in the vicinity of the point A at the highest position on the profile line 4a shown in FIG. 5A, wherein the inner wall surface of the upper wall 2a in a direction along the profile line is further inclined. Furthermore, the chain double-dashed line 2a2 represents the mountain section which is formed in the vicinity of the point C at the lowest position on the profile line 4a shown in FIG. 5A as in the first embodiment, wherein the inner wall surface of the upper wall 2a in a direction along the profile line is further inclined.

As described above, in the first embodiment, the inner wall surface of the upper wall 2a is not inclined uniformly in one direction in the vicinity of the profile line 4a of the vent hole 4 formed on the upper wall 2a, but is inclined at least a predetermined amount along a direction in which the profile line 4a extends throughout the entire circumference of the vent hole 4, as indicated with the chain double-dashed lines 2a1 and 2a2 of FIG. 4B. In this manner, the water droplet or oil droplet 7, which has dropped on the point A at the highest position on the profile line 4a, can smoothly flow on the inner wall surface, which is inclined in the direction of movement of the water droplet or oil droplet 7, along the profile line 4*a*. Moreover, the water droplet or oil droplet 7, which is positioned in the vicinity of the point C at the lowest position on the profile line 4*a*, can easily reach the point C by moving on the inner wall surface, which is inclined in the direction of movement of the water droplet or oil droplet 7, along the profile line.

Similarly, in the second embodiment as well, the end surface 9*a* of the rib 9 formed along the profile line 4*a* of the vent hole 4 is not inclined uniformly in one direction, but is always inclined at least a predetermined amount in a direction of extension of the rib 9 (or in a direction of the tangential line of the profile line 4*a*). Specifically, as with the first embodiment, a valley section equivalent to the valley section 2*a*1 shown in FIG. 4B is formed on the end surface 9*a* of the rib 9 which is in the vicinity of the point A at the highest position on the profile line 4*a*, and a mountain section equivalent to the mountain section 2*a*2 shown in FIG. 4B is formed on the end surface 9*a* of the rib 9 which in the vicinity of the lowest point C. In this manner, the water droplet or oil droplet 7, which has dropped in the vicinity of the point A at the highest position on the profile line 4*a*, can smoothly flow to a lower section along the end surface 9*a* of the rib 9, which is inclined in the direction of movement of the water droplet or oil droplet 7. Moreover, the water droplet or oil droplet 7, which is positioned in the vicinity of the point C at the lowest position on the profile line 4*a*, can easily reach the point C by moving on the end surface 9*a* of the rib 9, which is inclined in the direction of movement of the water droplet or oil droplet 7.

It should be noted that, in the above-described embodiments, one side wall of the casing 2 is taken as an opening section, and the display section 1 is attached to the opening section so that the display section 1 also functions as the one side wall of the casing. However, the opening section may not be provided in the casing so that an integrated molded component is configured, or alternatively the opening section may be provided to configure the side wall with a member other than the display section.

What is claimed is:

1. A casing structure for electronic equipment in which a fan motor is attached to an upper part of a vent hole formed on an upper wall of a casing,
   wherein a rib protruding downward is provided on an inner wall surface of the upper wall in the casing at a periphery of the vent hole,
   an end surface of the rib is formed as an inclined surface in which one side wall of the casing is lowered and the other side wall or an opening across therefrom is raised, and
   the rib is provided on the upper wall such that the end surface thereof is not raised in mid-course but only descends at least between a point of the highest position of the rib and a point in which the end surface intersects with a line which passes through substantially the center of the vent hole and is perpendicular to the inclination direction of the end surface.

2. The casing structure for electronic equipment according to claim 1, wherein the vent hole is formed on the upper wall of the casing such that a point of the lowest position on the profile line or two or more points of locally low positions on the profile line is formed on the one side wall of the casing.

3. The casing structure for electronic equipment according to claim 1, wherein an amount of protrusion of the rib from the inner wall surface of the upper wall of the casing is the minimum at the vicinity of the point of the highest position on the profile line of the vent hole on the inclined surface, and the amount of the protrusion is enlarged gradually from the point along a direction of extension of the rib, to form a valley section.

4. The casing structure for electronic equipment according to claim 1, wherein an amount of protrusion of the rib from the inner wall surface of the upper wall of the casing is the maximum at the vicinity of the point of the lowest position or the locally low point on the profile line of the vent hole on the inclined surface, and the amount of the protrusion is reduced gradually from that point along a direction of extension of the rib, to form a mountain section.

5. The casing structure for electronic equipment according to claim 1, wherein, in order to form the inclined surface on the end surface of the rib, the length of the protrusion of the rib from the upper wall of the casing to a lower section is changed continuously or stepwise in one direction.

6. The casing structure for electronic equipment according to claim 1, wherein, in order to form the inclined surface on the end surface of the rib, the upper wall of the casing in which the rib is formed is inclined, and the length of the downward protrusion of the rib from the upper wall of the casing is made constant throughout the whole length of the rib.

7. The casing structure for electronic equipment according to claim 1, wherein the fan motor is attached to the upper wall of the casing via a protruding section formed on the upper wall.

* * * * *